United States Patent [19]
Liu et al.

[11] Patent Number: 6,124,608
[45] Date of Patent: Sep. 26, 2000

[54] NON-VOLATILE TRENCH SEMICONDUCTOR DEVICE HAVING A SHALLOW DRAIN REGION

[75] Inventors: Yowjuang William Liu, San Jose; Yu Sun; Donald L. Wollesen, both of Saratoga, all of Calif.

[73] Assignee: Advanced Micro Devices, Inc., Sunnyvale, Calif.

[21] Appl. No.: 08/992,961

[22] Filed: Dec. 18, 1997

[51] Int. Cl.$^7$ .................................................. H01L 29/788
[52] U.S. Cl. ........................ 257/315; 257/321; 257/322; 257/330; 257/332
[58] Field of Search .................................. 257/315, 321, 257/330, 322, 332; 438/259

[56] References Cited

U.S. PATENT DOCUMENTS

| | | | |
|---|---|---|---|
| 4,796,228 | 1/1989 | Baglee | 365/185.28 |
| 4,868,619 | 9/1989 | Mukherjee et al. | 257/300 |
| 5,078,498 | 1/1992 | Kadakia et al. | 257/330 |
| 5,146,426 | 9/1992 | Mukherjee et al. | 365/149 |
| 5,274,588 | 12/1993 | Manzur et al. | 365/185 |
| 5,315,142 | 5/1994 | Acovic et al. | 257/316 |
| 5,338,958 | 8/1994 | Mitsumoto | 257/330 |
| 5,392,237 | 2/1995 | Iida | 365/185 |
| 5,486,714 | 1/1996 | Hong | 257/321 |
| 5,640,034 | 6/1997 | Malhi | 257/341 |

*Primary Examiner*—Mahshid Saadat
*Assistant Examiner*—George C. Eckert, II

[57] ABSTRACT

A non-volatile memory device having a trench structure and a shallow drain region is formed in a substrate, thereby facilitating increased densification, improved planarization and low power programming and erasing. Embodiments include forming first and second trenches in a substrate and, in each trench, sequentially forming a substantially U-shaped tunnel dielectric layer and a substantially U-shaped floating gate electrode. A dielectric layer is then formed on the floating gate electrode extending on the substrate surface and a substantially T-shaped control gate electrode is formed filling the trench and extending on the substrate. Sidewall spacers are formed on side surfaces of the control gate electrode and dielectric layer, followed by ion implantation to form a shallow drain region between the first and second trenches and source regions extending to a greater depth than the drain region. During ion implantation, a region containing an impurity of the first conductivity type is formed at the intersection of each trench and the substrate surface to prevent shorting between the source/drain region and gate electrodes.

28 Claims, 2 Drawing Sheets

NON-VOLATILE TRENCH SEMICONDUCTOR DEVICE HAVING A SHALLOW DRAIN REGION

RELATED APPLICATIONS

This subject matter involved in the present application is similar to the subject matter involved in application Ser. No. 08/993,890 filed on Dec. 18, 1997 now U.S. Pat. No. 6,002,151.

TECHNICAL FIELD

The present invention relates to a non-volatile semiconductor device and to a method for making such a device. The invention has particular applicability in manufacturing very large scale integration and high density non-volatile semiconductor devices with submicron features and active regions isolated by shallow insulated trenches.

BACKGROUND ART

Conventional non-volatile semiconductor devices include various types of flash memory devices, electrically programmable read only memory (EPROM) devices and electrically erasable programmable read only memory (EEPROM) devices. Such conventional types of semiconductor devices are generally characterized by a floating gate and an electrical connection called a control gate, typically fabricated from polycrystalline silicon doped with an appropriate doping material to render the polycrystalline conductive, e.g., phosphorous. The floating gate is separated from a substrate region by a gate dielectric or tunnel dielectric layer of insulating material while the substrate region includes symmetrical or asymmetrical source/drain regions defining a channel region therebetween. The floating gate and control gate are typically separated by a layer of insulating material.

EEPROMs are typically programmed by applying a voltage to the control gate so that electrons or a charge tunnels through the tunnel oxide layer and is stored on the floating gate in a capacitive manner. Erasing is implemented by grounding the control gate and causing electrons or charge to tunnel through the tunnel dielectric layer to the substrate. Typically, electrons tunnel through the tunnel dielectric layer by a phenomenon called "Fowler-Nordheim" tunneling. A conventional EEPROM is disclosed by Mukherjee et al., U.S. Pat. No. 4,868,619 and comprises an asymmetrical drain-source junction as illustrated in FIG. 4.

Adverting to FIG. 4, shallow drain region 54 is formed in substrate 52 at a shallower depth than source region 56. Channel 58 is defined between source 56 and drain 54. Source 56 is a double diffused region comprising a deep phosphorous region 80 and a shallow arsenic region 78. Gate dielectric 60 is formed over channel 58 and extends between drain 54 overlapping a portion 62 of source 56. The gate dielectric 60 is relatively uniformly thin over its entire cross section. Floating gate 64 is formed over gate dielectric 60, and a second dielectric layer 66 is formed over floating gate 64. Control gate 68 is then formed over dielectric layer 66. In operation, programming of the EEPROM depicted in FIG. 4 is achieved by raising the drain 54 and control gate 68 to predetermined potentials above that of the source 56, so that hot electrons 32 are generated and accelerated across the gate dielectric 60 onto floating gate 64. Erasing is achieved by floating the drain node 54, holding the control gate 68 at ground potential, and applying a pulse of high voltage to the source 56. Dielectric layer 66 typically comprises a material having a high dielectric constant, i.e., greater than about 5, such as tantalum pentoxide or silicon nitride. Gate dielectric 60 typically has a thickness of about 100 Å to about 200 Å and comprises an oxynitride. Overlap region 62 is maintained small, e.g., about 0.3 to about 0.4 micrometers. Fowler-Nordheim tunneling requires a very thin dielectric layer, thereby necessitating a gate dielectric 60 thickness of about 100 Å to about 200 Å.

The escalating demands for high densification and performance associated with ultra large scale integration semiconductor devices requires design features of 0.25 microns and under, increased transistor and circuit speeds, sharp junctions, high reliability and increased manufacturing throughput for competitiveness. The reduction of design features to 0.25 microns and under generates numerous problems challenging the limitations of conventional semiconductor technology.

Non-volatile semiconductor devices, such as the EEPROM depicted in FIG. 4, occupy a significant amount of precious real estate on a semiconductor substrate and, hence, pose a serious impediment to miniaturization. Moreover, the protrusion of the gate electrodes above the main surface of a substrate results in the formation of a significant step portion which is difficult to planarize, thereby challenging the depth of focus limitations of conventional photolithographic techniques.

Accordingly, there exists a need for reliable non-volatile semiconductor devices having design features of less than about 0.25 microns. There also exists a need for reliable non-volatile semiconductor devices having substantially uniform topography.

DISCLOSURE OF THE INVENTION

An object of the present invention is a non-volatile semiconductor device having improved device scalability, uniform topography and low power programming and erasing.

Another object of the present invention is a method of manufacturing a non-volatile semiconductor device having improved device scalability, uniform topography and low power programming and erasing.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising: a substrate having a main surface and containing an impurity of the first conductivity type; first and second trenches formed in the substrate, each trench comprising: (a) first and second side surfaces intersecting the main surface at edges and extending into the substrate; and (b) a bottom surface joining the first side surface at a first corner and the second side surface at a second corner within the substrate; a substantially U-shaped tunnel dielectric layer lining each trench; a substantially U-shaped floating gate electrode on the tunnel dielectric layer in each trench; a dielectric layer on each floating gate electrode and extending on the edges and a portion of the main surface terminating in side surfaces; and a control gate electrode having: (a) a first portion extending below the main surface on the dielectric layer in each trench; and (b) a second portion extending on each dielectric layer on the main surface terminating in side surfaces; a drain region containing an impurity of a second conductivity type extending from the main surface into the substrate to a first depth between the second side surface of the first trench and the first side surface of the second trench; a channel region containing an impurity of the first conductivity type extending between the second side surface of the first trench and first side surface of the second trench under the drain region; a first source region, containing an impurity of the second conductivity type, and extending from the main surface into the substrate to a second depth, greater than the first depth, along the first side surface of the first trench; and a second source region, containing an impurity of the second conductivity type, and extending from the main surface into the substrate to a third depth, greater than the first depth, along the second side surface of the second trench.

Another aspect of the present invention is a method of manufacturing a semiconductor device, which method comprises: forming first and second trenches in a substrate, each trench comprising: (a) first and second side surfaces intersecting the main surface at edges and extending into the substrate; and (b) a bottom surface joining the first side surface at a first corner and the second side surface at a second corner within the substrate; forming a substantially U-shaped tunnel dielectric layer lining each trench; forming a substantially U-shaped floating gate electrode on the tunnel dielectric layer in each trench; forming a dielectric layer on each floating gate electrode extending on the trench edges and a portion of the main surface terminating in side surfaces; forming a control gate on each dielectric layer, each control gate comprising: (a) a first portion extending below the main surface on the dielectric layer in each trench; and (b) a second portion extending on each dielectric layer on the main surface terminating in side surfaces; forming a drain region containing an impurity of a first conductivity type extending from the main surface into the substrate to a first depth between the second side surface of the first trench and the first side surface of the second trench; forming a first source region extending from the main surface into the substrate to a second depth, greater than the first depth, along the first side surface of the first trench; and forming a second source region extending from the main surface into the substrate to a third depth, greater than the first depth, along the second side surface of the second trench; wherein, the semiconductor device comprises a channel region containing an impurity of a second conductivity type extending between the second side surface of the first trench and first side surface of the second trench under the drain region.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
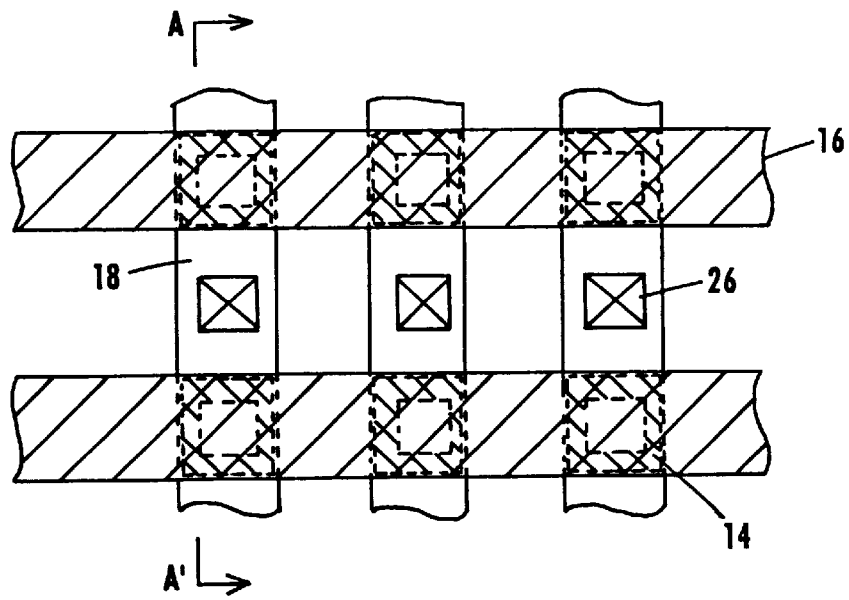
FIG. 1 schematically illustrates a plan view of an embodiment of the present invention.

The present invention addresses and provides an efficient solution to problems generated by the ever increasing demands for high integration and reduced feature sizes by forming a volatile semiconductor device, such as an EEPROM, in a trench formed in a substrate. The formation of an EEPROM in a trench in accordance with the present invention further achieves substantially uniform planarity or topography, thereby enabling accurate formation of fine features within the capabilities of conventional photolithographic techniques. It was found that the present invention achieves additional advantages, such as high floating gate coupling ratios for enhanced device performance, larger tunneling areas for Fowler-Nordheim programming. The inventive semiconductor devices require low power for programming and erasing with an attendant increase in efficiency, are capable of enhanced bulk erasing via the corners as in a DINOR operation, and exhibit low source/drain resistance. The present invention is compatible with conventional processing equipment and achieves a significantly increased denser layout when employed with shallow trench isolation technology. The present invention is applicable to various conventional circuits, exhibits high operating speeds, improved reliability, accuracy and efficiency, a high signal-to-noise ratio, and superior process control at a reduced manufacturing cost.

In copending application Ser. No. 08/993,890 filed on Dec. 18, 1997, a semiconductor device and methodology are disclosed for forming non-volatile semiconductor devices in trenches. The present invention is characterized by substantially similar advantages as disclosed in copending application Ser. No. 08/993,890 filed on Dec. 18, 1997. In addition, in accordance with the present invention, a shallow drain region is formed, thereby providing additional advantages. For example, channel length can be controlled without dependence upon the limitations of conventional photolithographic techniques.

In accordance with the present invention, first and second trenches are formed in a substrate. As used throughout this application, the term "substrate" denotes a semiconductor substrate, an epitaxial layer formed on a semiconductor substrate or a well region formed in a semiconductor substrate. In various embodiments of the present invention, each trench can be formed in the substrate surface in a conventional manner, e.g., employing conventional trench isolation methodology. Each trench formed in the substrate comprises side surfaces, each side surface having one end intersecting the main surface at an edge and another end extending into the substrate. The side surfaces of each trench extending into the substrate are connected by a bottom surface forming corners. A dielectric layer is then formed lining each trench. Embodiments of the present invention include forming a substantially U-shaped tunnel dielectric layer, typically having a thickness less than about 200 Å, e.g., about 20 Å to about 200Å. The tunnel dielectric layer can comprise any of various dielectric materials typically employed in conventional EEPROMs as a tunnel dielectric layer, e.g., a nitrided silicon oxide. The tunnel dielectric layer can be formed by thermal oxidation or chemical vapor deposition followed by nitrogen ion implantation or rapid thermal annealing in a nitrogen environment.

A floating gate electrode is then formed on each tunnel dielectric layer. Embodiments of the present invention include forming a substantially U-shaped floating gate electrode on a substantially U-shaped tunnel dielectric layer.

A dielectric layer is then formed on each floating gate electrode extending on the trench edges and a portion of the main surface terminating in side surfaces. The dielectric layer can comprise any of various dielectric materials typically formed between the floating gate and control gate electrodes in conventional EEPROMs, e.g., a composite stack of silicon oxide/silicon nitride/silicon oxide.

A control gate electrode is then formed on each dielectric layer. The control gate electrode has a first portion which extends below the main surface of the dielectric layer in the trench and a second portion extending on the dielectric layer on the main surface terminating in side surfaces. Embodiments of the present invention include forming a substantially T-shaped control gate electrode.

Sidewall spacers are then formed on the side surfaces of each dielectric layer and second portion of each control gate electrode. The sidewall spacers can comprise a dielectric material such as silicon nitride or silicon oxynitride.

Ion implantation is then conducted, using the dielectric layer, control gate electrode and sidewall spacers as a mask, to implant an impurity of a conductivity type different from that of the substrate to form a shallow drain implant region extending from the main surface into the substrate to a first depth between the trenches. In forming the shallow drain implant region, the implantation dosage and energy can be controlled to achieve a desired depth employing dosages and implantation energies readily optimized for a particular situation. For example, it has been found suitable to implant impurity ions of the second conductivity type at a dosage of about $5 \times 10^{14}$ atoms cm$^{-2}$ to about $1 \times 10^{16}$ atoms cm$^{-2}$ at an energy of about 1 KeV to about 30 KeV, resulting in a shallow drain region which, after activation annealing, extends to a depth from the main surface of about 100 Å to about 1,000 Å. In preferred embodiments, multiple ion implantations are conducted to form the source region; while the drain region is formed employing a single ion implantation. Upon ion implantation to form the drain implant, an impurity region of the same conductivity type as a substrate is formed under the sidewall spacers at the trench corners between the first and second trenches entirely within the drain implant region. Such isolated impurity regions of the first conductivity type shield the drain region from shorting to the control gate or floating gate.

The drain region is then masked and ion implantation is conducted to form first and second source implant regions, extending into the substrate, typically to substantially the same depth but greater than the depth of the drain implant region. The implantation dosage and energy in forming the source implant regions can be controlled to achieve a desired depth. For example, it has been found suitable to form the source implant regions by ion implanting an impurity of the second conductivity type at a dosage of about $5 \times 10^{14}$ atoms cm$^{-2}$ to about $1 \times 10^{16}$ atoms cm$^{-2}$ at an energy of about 10 KeV to about 500 KeV resulting in source regions, after activation annealing, extending to a depth less than about 0.5 microns, in embodiments wherein the source regions do not extend as far as the trench corners. In other embodiments, it has been found suitable to ion implant an impurity of the second conductivity type at a dosage of about $5 \times 10^{14}$ atoms cm$^{-2}$ to about $1 \times 10^{16}$ atoms cm$^{-2}$ at an energy of about 10 KeV to about 1,500 KeV, resulting in source regions, after activation annealing, extending into the substrate to a depth greater than the depth of the trench corners so that each source region extends below a side surface, along the corner and along the bottom surface of a trench. The source/drain implant regions are activated in a conventional manner to form the active source/drain regions.

In embodiments wherein the source regions do not extend into the substrate below the trench corners, the channel region is formed below the drain region. In embodiments wherein the source regions extend below the trench corners, the channel region extends between the drain and the source regions along the side of the trench.

Embodiments of the present invention include forming trenches having rounded corners to avoid the generation of high electrical fields due to stresses at sharp trench corners. Embodiments of the present invention include rounding the trench corners by forming a sacrificial oxide layer after forming the trench and removing the sacrificial oxide layer, resulting in rounding of the trench corners in the substrate. In the embodiment depicted in FIG. 3, the drain and source regions can be reversed.

Embodiments of the present invention also comprise forming a metal silicide layer, e.g., a refractory metal silicide such as tungsten or titanium silicide, on the surface of the control gates and/or the source/drain regions. A dielectric interlayer, such as silicon oxide, is then deposited on the main surface, and a through-hole is formed in the dielectric interlayer exposing the metal silicide layer on the drain region. The through-hole is then filled with conductive material, such as an initial adhesion promoting titanium nitride layer followed by tungsten, to provide an electrical contact with the drain region. Copper or aluminum can also be deposited in the through-hole to form the contact. Conventional methodology can be employed to deposit the metal silicide layer and dielectric interlayer, form the through-hole and to fill the through-hole with conductive material.

The present invention is capable of providing non-volatile semiconductor devices, such as EEPROM devices, satisfying the ever increasing drive for high densification and reduced feature sizes. For example, embodiments of the present invention include forming trenches in a substrate, each trench having a width of about 0.1 microns to about 0.5 microns and extending to a depth of about 0.1 microns to about 0.5 microns. The floating gate electrode typically has a uniform thickness of about 100 Å to about 1,500 Å. The first portion of each control gate electrode extends into the substrate and on the dielectric layer and typically has a thickness of about 100 Å to about 1,500 Å, while the second portion of the control gate electrode extends on the substrate surface and typically has a thickness of about 1,000 Å to about 3,000 Å. Embodiments of the present invention include forming sidewall spacers, typically having a suitable thickness, such as about 100 Å to about 2,000 Å.

In accordance with the present invention, a shallow drain region is formed which extends into a substrate, typically to a depth of 0.1 microns to about 0.5 microns. The source regions are formed in the substrate to a depth greater than the depth of the shallow drain region, thereby resulting in asymmetric source/drain regions, avoiding the complex double implantation procedure disclosed in U.S. Pat. No. 4,868,619.

Figure 2:
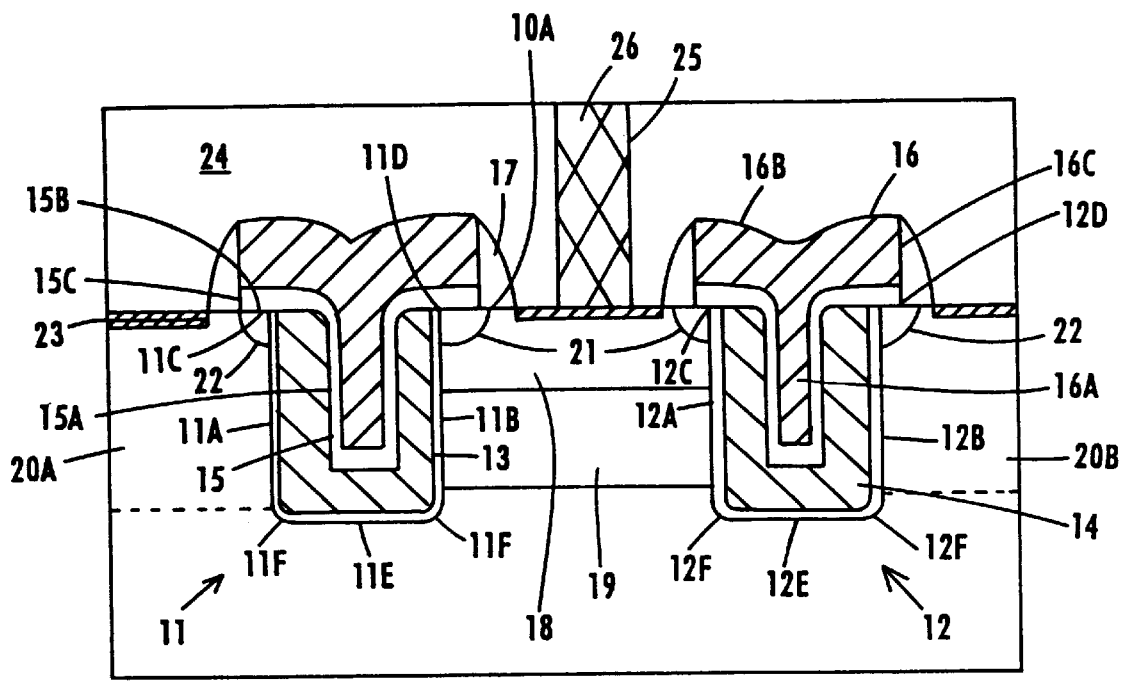
FIG. 2 is a cross sectional view taken along line A–A' of FIG. 1.

An embodiment of the present invention is illustrated in FIGS. 1 and 2, wherein FIG. 2 is a cross sectional view taken along line A–A' of the plan view illustrated in FIG. 1. Adverting to FIGS. 1 and 2, first trench 11 and second trench 12 are formed in substrate 10, e.g., a semiconductor substrate comprising monocrystalline silicon doped with a P-type impurity. Alternatively, a semiconductor substrate comprising monocrystalline silicon doped with an N-type impurity can be provided with a well region containing a P-type impurity. First trench 11 comprises a first side surface 11A and second side surface 11B. First side surface 11A intersects the main surface of substrate 10 at trench edge 11C, while second side surface 11B intersects the main surface of substrate 10 at a second trench edge 11D. First 11A and second 11B side surfaces of trench 11 extend into substrate 10 and are joined by a bottom surface 11E at trench corners 11F.

Similarly, second trench 12 comprises a first side surface 12A intersecting the main surface of substrate 10 at first trench edge 12C, and second side surface 12B intersecting the main surface of a substrate 10 at second trench corner 12D. First 12A and second 12B side surfaces of second trench 12 are joined by bottom surface 12E connecting trench corners 12F in substrate 10.

Each trench preferably contains rounded corners formed by thermally oxidizing the trench after formation to form a sacrificial oxide layer. As the oxidation rate in the horizontal direction is generally greater than the oxidation rate in the vertical direction, rounded trench corners are formed. The sacrificial oxide liner can be formed at an appropriate thickness such as about 50 Å to about 500 Å and is then removed. The rounded trench corners prevent generation of a high electric field which would otherwise occur due to stress at sharp trench corners, thereby improving device performance.

After forming the trenches with rounded corners, a tunnel dielectric layer 13 is formed lining each trench in the substrate. Embodiments of the present invention include forming each tunnel dielectric layer 13 by thermal oxidation at a temperature of about 1,000° or higher. As tunnel dielectric layer 13 lines each trench, it is generally formed in substantially U-shaped configuration.

A floating gate electrode 14 is then formed on each tunnel dielectric layer 13 in a substantially U-shaped configuration. Each floating gate electrode 14 typically comprises polycrystalline silicon and is typically formed by depositing a conformal layer of doped polycrystalline silicon, as by chemical vapor deposition, wherein the deposited polycrystalline silicon layer generally conforms to the substantially U-shaped opening of each trench lined with the substantially U-shaped tunnel dielectric layer 13. Etching is then conducted, followed by planarization, as by chemical mechanical polishing, such that each tunnel dielectric layer 13 and each floating gate electrode 14 are substantially flush with main surface 10A of substrate 10.

A dielectric layer 15 is then formed on each floating gate electrode 14. Each dielectric layer 15 comprises a first substantially U-shaped portion 15A which lines the exposed portion of each floating gate electrode 14 extending into substrate 10, and a second portion 15B which extends on the edges of each trench and a portion of the main surface 10A terminating at side surfaces 15C. A control gate 16, typically comprising doped polycrystalline silicon, is then formed on each dielectric layer 15. Each control gate electrode 16 comprises a substantially vertically extending portion 16A filling each trench and a substantially horizontally extending portion 16B extending on the second portion 15B of each dielectric layer 15 terminating in side surfaces 16C, generally substantially coplanar with side surfaces 15C of dielectric layer 15.

Sidewall spacers 17 are then formed on side surfaces 16C of each control gate electrode 16 and 15C of each dielectric layer 15. Using the dielectric portion 15B, control gate portion 16B and sidewall spacers 17 as a mask, ion implantation is then conducted to form drain implant region 18.

Ion implantation is conducted to form impurity regions 21 and 22 of the first conductivity type at second trench edge 11D of first trench 11 and at first trench etch 12C of second trench 12. These impurity regions 21 and 22 shield the drain region against shorting to the control gate electrodes. In accordance with the present invention, drain implant region 18 is formed relatively shallow vis-a-vis the source regions. For example, it has been found suitable to ion implant an impurity of the second conductivity type, such as arsenic, at an implantation dosage of about $5 \times 10^{14}$ atoms $cm^{-2}$ to about $1 \times 10^{16}$ atoms $cm^{-2}$ and an implantation energy of about 1 KeV to about 30 KeV to form drain region 18 which, after activation annealing, extends to a depth of about 0.01 microns to about 0.1 microns within substrate 10. The exposed portion of main surface 10A of substrate 10 overlying drain region 18 is then masked, in a conventional manner, as by depositing a photoresist layer, an ion implantation is conducted to form first source implant region 20A and second source implant region 20B, generally extending to substantially the same depth in substrate 10. In the embodiment depicted in FIG. 2, the first 20A and second 20B source regions do not extend to the trench corners. Typically, each trench extends into the substrate to a depth of about 0.1 microns to about 0.5 microns. In the embodiment depicted in FIG. 2, each source region is formed by ion implanting an impurity of the second conductivity type, such as arsenic, at an implantation dosage of about $5 \times 10^{14}$ atoms $cm^{-2}$ to about $1 \times 10^{16}$ atoms $cm^{-2}$ at an implantation energy of about 10 KeV to about 500 KeV to form first source region 20A and second source region 20B which, after activation annealing, extend to a depth of about 0.1 microns to about 0.5 microns in the substrate. Ion implantation to form the first and second source regions is preferably conducted in a plurality of ion implantation steps. Upon activation annealing, the channel region 19 is formed extending between the second side surface 11B of first trench 11 and first side surface 12A of second trench 12 below drain region 18.

Silicide layers 23, typically a refractory metal silicide such as tungsten or titanium silicide, are then formed on source/drain regions in a conventional manner, as by deposition of the metal silicide or by deposition of the metal followed by heating to effect reaction between the deposited metal and underlying silicon. In other embodiments, a metal silicide layer is formed on each control gate electrode 16 (not shown in the FIG. 2 embodiment) in addition to forming metal silicide layers on the source/drain regions.

A dielectric interlayer 24 is then formed on main surface 10A and a through-hole 25 formed therein. Through-hole 25 exposes a portion of metal silicide layer 23 on drain region 18. Through-hole 25 is then filled with conductive material 26, such as copper, aluminum or tungsten, in a conventional manner.

Figure 3:
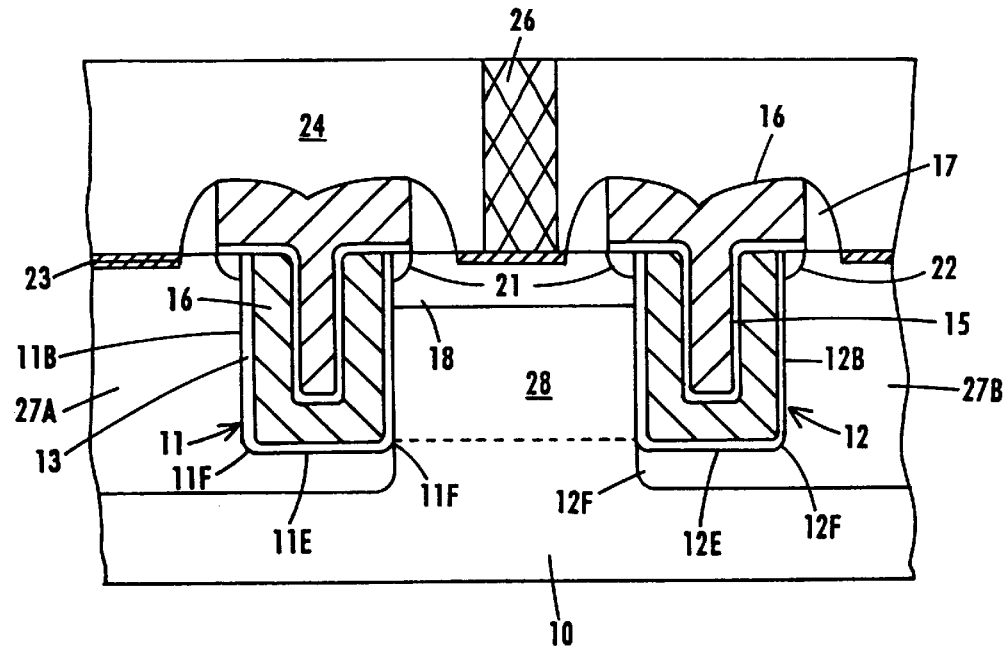
FIG. 3 illustrates another embodiment of the present invention.
Figure 4:
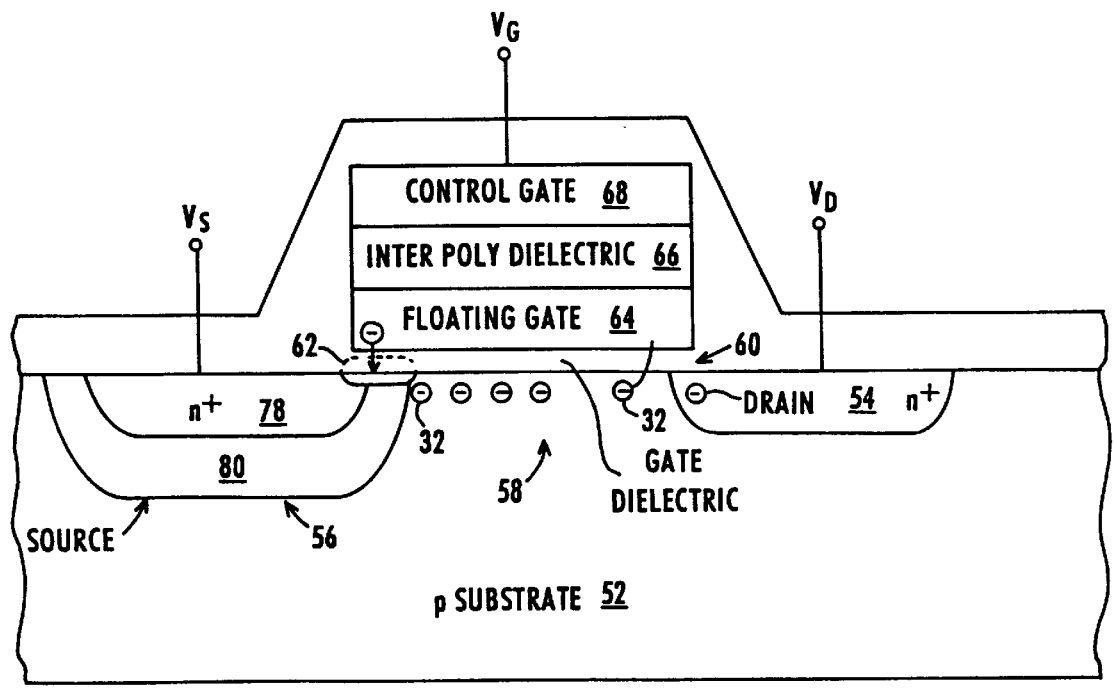
FIG. 4 illustrates a conventional EPROM with an asymmetric drain/source junction.

Another embodiment of the present invention is schematically illustrated in FIG. 3, wherein elements similar to those in FIG. 2 bear similar reference numerals. The embodiment depicted in FIG. 3 is similar to the embodiment depicted in FIG. 2 and, to the extent of such similarity, features are not described in detail. The FIG. 3 embodiment differs from the FIG. 2 embodiment in that source/drain regions 27A and 27B extend into the substrate 10 to a depth greater than the depth of the trenches. As shown in FIG. 3, first source region 27A and 27B are formed at substantially the same depth but extend into substrate 10 below first side surface 11B of first trench 11 and below second side surface 12B of second trench 12, respectively. In addition, first 27A and second 27B source regions extend along bottom surface 11E of first trench 11 and bottom surface 12E of second trench 12, respectively. As a result, channel region 28 extends to a greater depth into substrate 10 than channel region 19 of the FIG. 2 embodiment, extending below trench corners 11F and 12F between first source region 27A and second source region 27B. The dosage and energy of ion implantation to form the source regions in the FIG. 3 embodiment can be optimized in a particular situation depending upon the depth of the trenches. For example, in embodiments wherein the trenches extend into the substrate to a depth of about 0.1 microns to about 0.5 microns, it has been found suitable to employ an implantation dosage of about $5\times10^{14}$ atoms $cm^{-2}$ to about $1\times10^{16}$ atoms $cm^{-2}$ at an implantation energy of about 10 KeV to about 1,500 KeV, wherein source regions 27A, 27B, after activation annealing, extend to a depth of about 0.2 microns to about 1.5 microns in substrate 10. Conveniently, multiple ion implantations can be employed to form the source regions in the FIG. 3 embodiment.

In the various embodiments of the present invention, the source implant regions can be initially formed, masked and then the drain implant region can be formed subsequent to formation of the source implant regions. The source implant regions are subsequently activated by activation annealing to form the active source and drain regions, typically at a temperature of about 1,000° C. for about 60 minutes. Such an activation annealing of the source implant regions is preferably performed prior to implanting the drain region which can be subsequently activated, as by a rapid thermal anneal, as, for example, at about 900° C. for about 1 minute.

The present invention enables the formation of non-volatile semiconductor devices, such as EPROMs and EEPROMs, having reduced feature sizes and, hence, significantly enhances integration and high densification, particularly in semiconductor devices having a design rule of about 0.25 microns and under. Semiconductor devices produced in accordance with the present invention have higher floating gate coupling ratios for enhanced device performance, larger tunneling areas for improved efficiency in programming and erasing, and low source/drain resistances. Significantly, the semiconductor devices of the present invention are characterized by substantially planar topography at the front and back ends during processing, thereby enabling the use of conventional photolithographic techniques to form fine feature sizes without challenging inherent depth of focus limitations. The present invention provides denser layouts by employing conventional trench isolation in combination with the non-volatile trench devices of the present invention. The semiconductor devices produced in accordance with the present invention are applicable to any of various types of circuitry. Thus, the present invention improves densification, increases operating speed, improves reliability, accuracy, efficiency and the signal-to-noise ratio, enables superior process control and reduces manufacturing costs, thereby providing a competitive advantage. The present invention can be employed in manufacturing various types of semiconductor devices.

The present invention can be practiced by employing conventional materials, methodology and equipment. Accordingly, the details of such materials, equipment and methodology are not set forth herein in detail. The present invention is applicable to the production of various types of semiconductor devices, and enjoys particular utility in the production of semiconductor devices containing flash memory devices and having a design rule less than about 0.25 microns.

In the previous descriptions, numerous specific details are set forth, such as specific materials, dimensions, structures, chemicals, processes, parameters, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention. only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A semiconductor device comprising:
   a substrate having a main surface and containing an impurity of a first conductivity type;
   first and second trenches formed in the substrate, each trench comprising:
   (a) first and second side surfaces intersecting the main surface at edges and extending into the substrate; and
   (b) a bottom surface joining the first side surface at a first corner and the second side surface at a second corner within the substrate;
   a substantially U-shaped tunnel dielectric layer lining each trench;
   a substantially U-shaped floating gate electrode on the tunnel dielectric layer in each trench;
   a dielectric layer on each floating gate electrode and extending on the edges and a portion of the main surface terminating in side surfaces; and
   a control gate electrode having:
   (a) a first portion extending below the main surface on the dielectric layer in each trench; and
   (b) a second portion extending on each dielectric layer on the main surface terminating in side surfaces;
   sidewall spacers on the side surfaces of the dielectric layers and second portion of the control gate electrode;
   a drain region containing an impurity of a second conductivity type extending from the main surface into the substrate to a first depth between the second side surface of the first trench and the first side surface of the second trench;
   a channel region containing an impurity of the first conductivity type extending between the second side surface of the first trench and first side surface of the second trench deeper into the substrate than the drain region;
   a first source region, containing an impurity of the second conductivity type, and extending from the main surface into the substrate to a second depth, greater than the first depth, along the first side surface of the first trench;
   an impurity region of the first conductivity type extending from the main surface at each trench edge of each trench into the substrate and entirely within a source/drain region; and
   a second source region, containing an impurity of the second conductivity type, and extending from the main surface into the substrate to a third depth, greater than the first depth, along the second side surface of the second trench, wherein each tunnel dielectric layer and floating gate electrode has an upper surface substantially flush with the main surface of the substrate, and the second and third depths are substantially the same.

2. The semiconductor device according to claim 1, wherein the first and second source regions extend into the substrate to a depth less than the trench corners.

3. The semiconductor device according to claim 1, wherein:
the first source region extends into the substrate below the first side surface along the first corner and along the bottom surface of the first trench;
the second source region extends into the substrate below the second side surface along the second corner and along the bottom surface of the second trench; and
the channel region extends below the second corner of the first trench and below the first corner of the second trench between the first and second source regions.

4. The semiconductor device according to claim 1, wherein the trench corners of each trench are rounded.

5. The semiconductor device according to claim 1, wherein the sidewall spacers have a width of about 10 Å to about 2,000 Å.

6. The semiconductor device according to claim 1, further comprising a metal silicide layer on the drain region.

7. The semiconductor device according to claim 6, further comprising:
a dielectric interlayer on the main surface;
a through-hole in the dielectric interlayer exposing a surface portion of the metal silicide layer on the drain region; and
a contact plug filling the through-hole in electrical contact wit h th e drain region.

8. The semiconductor device according to claim 1, wherein each tunnel dielectric layer comprises a nitrided silicon oxide.

9. The semiconductor device according to claim 1, wherein each dielectric layer comprises a composite of sequential layers of silicon oxide, silicon nitride and silicon oxide.

10. The semiconductor device according to claim 1, wherein each trench has a width of about 0.1 microns to about 0.5 microns and extends into the substrate to a depth of about 0.1 microns to about 0.5 microns.

11. The semiconductor device according to claim 1, wherein each tunnel dielectric layer has a thickness less than about 1,000 Å.

12. The semiconductor device according to claim 1, wherein each floating gate electrode has a substantially uniform thickness of about 100 Å to about 1,500 Å.

13. The semiconductor device according to claim 1, wherein the second portion of each control gate electrode has a thickness of about 1,000 Å to about 3,000 Å.

14. A method of manufacturing a semiconductor device, which method comprises:
forming first and second trenches in a substrate, each trench comprising:
(a) first and second side surfaces intersecting the main surface at edges and extending into the substrate; and
(b) a bottom surface joining the first side surface at a first corner and the second side surface at a second corner within the substrate;
forming a substantially U-shaped tunnel dielectric layer lining each trench;
forming a substantially U-shaped floating gate electrode on the tunnel dielectric layer in each trench;
forming a dielectric layer on each floating gate electrode extending on the trench edges and a portion of the main surface terminating in side surfaces;
forming a control gate on each dielectric layer, each control gate comprising:
(a) a first portion extending below the main surface on the dielectric layer in each trench; and
(b) a second portion extending on each dielectric layer on the main surface terminating in side surfaces;
forming a drain region containing an impurity of a first conductivity type extending from the main surface into the substrate to a first depth between the second side surface of the first trench and the first side surface of the second trench;
forming a first source region extending from the main surface into the substrate to a second depth, greater than the first depth, along the first side surface of the first trench;
forming a second source region extending from the main surface into the substrate to a third depth, greater than the first depth, along the second side surface of the second trench; and
ion implanting to form an impurity region of the first conductivity type extending from the main surface at each trench edge into the substrate and entirely within a source/drain implant region; wherein,
the semiconductor device comprises a channel region containing an impurity of a second conductivity type extending between the second side surface of the first trench and first side surface of the second trench under the drain region.

15. The method according to claim 14, wherein the second and third depths are substantially the same.

16. The method according to claim 15, wherein the first and second source regions and the channel region extends into the substrate to a depth less than the trench corners.

17. The method according to claim 16, comprising planarizing the main surface after forming each floating gate electrode and before forming each dielectric layer.

18. The method according to claim 15, comprising:
forming the first source region to extend into the substrate below the first side surface along the first corner and along the bottom surface of the first trench;
forming the second source region to extend into the substrate below the second side surface along the second corner and along the bottom surface of the second trench, and the channel region extends vertically along the trench sidewall.

19. The method according to claim 15, comprising thermally forming a sacrificial oxide liner in each trench and removing the sacrificial oxide liner from each trench prior to forming the tunnel dielectric layer in each trench, thereby rounding the trench corners.

20. The method according to claim 14, comprising:
ion implanting impurities of a second conductivity type at a dosage of about $5\times10^{14}$ atoms $cm^{-2}$ to about $1\times16$ atoms $cm^{-2}$ and at an energy of about 1 KeV to about 30 KeV to form the drain implant region; and
implanting impurities of the second conductivity type at a dosage of about $5\times10^{14}$ atoms $cm^{-2}$ to about $1\times10^{16}$ atoms $cm^{-2}$ and at a dosage of about 10 KeV to about 500 KeV to form the first and second source implant regions.

21. The method according to claim 14, comprising ion implanting impurities of the first conductivity type to form the impurity region extending from the main surface at each trench edge into the substrate entirely within a source/drain region at an implant dosage of $1\times10^{13}$ atoms $cm^{-2}$ to about $1\times10^{15}$ atoms $cm^{-2}$ at an implantation energy of about 1 KeV to about 20 KeV.

22. A semiconductor device comprising:

a substrate having a main surface and containing an impurity of a first conductivity type;

first and second trenches formed in the substrate, each trench comprising:
   (a) first and second side surfaces intersecting the main surface at edges and extending into the substrate; and
   (b) a bottom surface joining the first side surface at a first corner and the second side surface at a second corner within the substrate;

a substantially U-shaped tunnel dielectric layer lining each trench;

a substantially U-shaped floating gate electrode on the tunnel dielectric layer in each trench;

a dielectric layer on each floating gate electrode and extending on the edges and a portion of the main surface terminating in side surfaces; and a control gate electrode having:
   (a) a first portion extending below the main surface on the dielectric layer in each trench; and
   (b) a second portion extending on each dielectric layer on the main surface terminating in side surfaces;

a drain region containing an impurity of a second conductivity type extending from the main surface into the substrate to a first depth between the second side surface of the first trench and the first side surface of the second trench;

a channel region containing an impurity of the first conductivity type extending between the second side surface of the first trench and first side surface of the second trench deeper into the substrate than the drain region;

a first source region, containing an impurity of the second conductivity type, and extending from the main surface into the substrate to a second depth, greater than the first depth, along the first side surface of the first trench;

a second source region, containing an impurity of the second conductivity type, and extending from the main surface into the substrate to a third depth, greater than the first depth, along the second side surface of the second trench; and an impurity region of the first conductivity type extending from the main surface at each trench edge of each trench into the substrate and entirely within a source/drain region.

23. The semiconductor device according to claim 22, wherein the first and second source regions extend into the substrate to a depth less than the trench corners.

24. The semiconductor device according to claim 22, wherein:
   the first source region extends into the substrate below the first side surface along the first corner and along the bottom surface of the first trench;
   the second source region extends into the substrate below the second side surface along the second corner and along the bottom surface of the second trench; and
   the channel region extends below the second corner of the first trench and below the first corner of the second trench between the first and second source regions.

25. The semiconductor device according to claim 22, wherein the trench corners of each trench are rounded.

26. The semiconductor device according to claim 22, further comprising sidewall spacers on the side surfaces of the dielectric layers and second portion of the control gate electrodes.

27. The semiconductor device according to claim 22, further comprising a metal silicide layer on the drain region.

28. The semiconductor device according to claim 27, further comprising:
   a dielectric interlayer on the main surface;
   a through-hole in the dielectric interlayer exposing a surface portion of the metal silicide layer on the drain region; and
   a contact plug filling the through-hole in electrical contact with the drain region.

* * * * *